(12) United States Patent
Braune et al.

(10) Patent No.: US 7,824,941 B2
(45) Date of Patent: Nov. 2, 2010

(54) METHOD FOR PRODUCING AN LED LIGHT SOURCE COMPRISING A LUMINESCENCE CONVERSION ELEMENT

(75) Inventors: Bert Braune, Wenzenbach (DE); Herbert Brunner, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/421,814

(22) Filed: Apr. 10, 2009

(65) Prior Publication Data

US 2009/0197361 A1      Aug. 6, 2009

Related U.S. Application Data

(62) Division of application No. 10/532,848, filed as application No. PCT/DE03/03493 on Oct. 21, 2003, now abandoned.

(30) Foreign Application Priority Data

Oct. 30, 2002   (DE)   ................. 102 50 633
Dec. 10, 2002   (DE)   ................. 102 57 664

(51) Int. Cl.
   *H01L 21/56*   (2006.01)
(52) U.S. Cl. .............. 438/33; 438/26; 438/27; 438/29; 438/113; 438/114; 438/458; 438/464; 438/465; 257/E21.499; 257/E21.502; 257/E21.503
(58) Field of Classification Search ............ 438/26–27, 438/33, 113–114, 458, 464–465; 257/E21.499, 257/502–503
See application file for complete search history.

(56) References Cited

U.S. PATENT DOCUMENTS 5,757,836 A    5/1998   Jiang et al.
6,066,861 A    5/2000   Höhn et al.
6,185,240 B1   2/2001   Jiang et al.

(Continued)

FOREIGN PATENT DOCUMENTS

DE      199 45 134      5/2001

(Continued)

OTHER PUBLICATIONS

English translation of Office Action in Japanese application No. 2004-547408, dated Jun. 25, 2009.

*Primary Examiner*—Wael M Fahmy
*Assistant Examiner*—Minchul Yang
(74) *Attorney, Agent, or Firm*—Fish & Richardson P.C.

(57) ABSTRACT

The invention describes a method for producing a light-emitting-diode (LED) light source, particularly comprising mixed-color LEDs, wherein at least a portion of primary radiation emitted by a chip is transformed by luminescence conversion. Said chip comprises a front-side (i.e., the side facing in the direction of radiation) electrical contact to whose surface a luminescence conversion material is applied in the form of a thin layer. Prior to coating, the front-side electrical contact is raised by the application of an electrically conductive material to the electrical contact surface. The method enables specific color coordinates to be adjusted selectively by monitoring the color coordinates (IEC chromaticity diagram) and thinning the layer of luminescence conversion material. In addition, the method is suited in particular for simultaneously producing a plurality of LED light sources from a multiplicity of similar chips in a wafer composite.

20 Claims, 3 Drawing Sheets

U.S. PATENT DOCUMENTS

| | | |
|---|---|---|
| 6,350,668 B1 | 2/2002 | Chakravorty |
| 6,420,244 B2 * | 7/2002 | Lee .......................... 438/458 |
| 6,495,862 B1 | 12/2002 | Okazaki et al. |
| 6,504,181 B2 | 1/2003 | Furukawa et al. |
| 6,639,931 B1 | 10/2003 | Dowd et al. |
| 6,730,939 B2 | 5/2004 | Eisert et al. |
| 6,849,881 B1 | 2/2005 | Harle et al. |
| 2002/0028527 A1 | 3/2002 | Maeda et al. |
| 2002/0081773 A1 | 6/2002 | Inoue et al. |
| 2003/0077878 A1 | 4/2003 | Kumar et al. |

FOREIGN PATENT DOCUMENTS

| | | |
|---|---|---|
| DE | 100 06738 | 9/2001 |
| EP | 1 111 689 | 6/2001 |
| EP | 1 221 724 | 7/2002 |
| JP | 57-93591 | 6/1982 |
| JP | 59-19389 | 1/1984 |
| JP | 62-004351 | 1/1987 |
| JP | 9-27651 | 1/1997 |
| JP | 9-27657 | 1/1997 |
| JP | 10-012916 | 1/1998 |
| JP | 10-200159 | 7/1998 |
| JP | 11-298047 | 10/1999 |
| JP | 2000-208822 | 7/2000 |
| JP | 2000-312033 | 11/2000 |
| JP | 2001-177158 | 6/2001 |
| JP | 2002-118293 | 4/2002 |
| JP | 2002-261325 | 9/2002 |
| WO | WO 97/50132 | 12/1997 |
| WO | WO 98/12757 | 3/1998 |
| WO | WO 01/39282 | 5/2001 |

* cited by examiner

METHOD FOR PRODUCING AN LED LIGHT SOURCE COMPRISING A LUMINESCENCE CONVERSION ELEMENT

CROSS-REFERENCE TO RELATED APPLICATIONS

This application is a divisional of U.S. application Ser. No. 10/532,848, filed Apr. 27, 2005 now abandoned, which is the National Stage of International Application No. PCT/DE2003/003493, filed Oct. 21, 2003, which claims the benefit of German Patent Applications Serial No. 10250633.7, filed on Oct. 30, 2002 and 10257664.5 filed on Dec. 10, 2002. The contents of the prior applications are hereby incorporated by reference in their entirety.

TECHNICAL FIELD

The invention relates to a method for producing a an LED (light-emitting-diode) light source wherein at least a portion of primary radiation emitted by a chip is wavelength-converted. In this method, a luminescence conversion element is applied directly to the chip surface in the form of a thin layer.

BACKGROUND

A component comprising a luminescence conversion element is known, for example, from Pre-Published German Patent Application WO 97/50132. It comprises a semiconductor chip that emits primary radiation when in operation, and a luminescence conversion element by means of which a portion of the primary radiation is converted into light of another wavelength. The resulting optically perceptible radiation from the LED light source is created by overlapping of the two radiations, so that light sources particularly emitting white light can be produced by this means.

The luminescence conversion element ordinarily comprises a phosphor embedded in a matrix material. Suitable for use as phosphors are, for example, inorganic phosphors, such as garnets doped with rare earths (particularly Ce), or organic phosphors, such as perylene phosphors. Further suitable phosphors are cited for example in WO 98/12757, whose content in that respect is incorporated herein by reference.

To obtain particularly good mixing of the radiation and thus a resultant radiation that is largely chromatically homogeneous, it is advantageous to apply the phosphor directly and evenly to the chip surface, so that the luminescence conversion element causes the smallest possible differences in the path length of the primary radiation. For example, the luminescence conversion material can be applied to the surface of the LED chip, in the form of a thin, homogeneous layer of constant thickness, even before the chip is mounted on a leadframe and electrically contacted. The application of thin layers can be performed in a number of ways and is suitable in particular for the simultaneous production of multiple LED light sources from LED chips disposed in a wafer composite along with a multiplicity of similar chips. This approach also, insofar as possible, prevents color fluctuations of the LED light sources due to sedimentation of the conversion materials.

However, a thin layer cannot be applied in a straightforward manner if the LED chip used has electrical contact layers on its front side (that is, the side facing in the direction of radiation), as is usually the case, for example, with GaN-based diodes on an SiC substrate. Care must be taken to preserve electrical contactability in coating the surfaces of such LED chips.

SUMMARY

The object underlying the present invention, therefore, is to develop a method for the simple and low-cost coating of LED chips comprising a front-side electrical contact.

This object is achieved by means of a method as set forth below.

A method from the following description particularly enables multiple LED light sources to be produced simultaneously from similar LED chips in a wafer composite.

The method also permits easy monitoring of the color coordinates (CIE chromaticity diagram) of the LED light source and thus also controlled adjustment of the color coordinates during the production process.

According to the method, an LED chip is prepared that has at least one top-side electrical contact in the form of an electrical contact surface. This electrical contact is then raised by being thickened by the application of an electrically conductive material to the electrical contact surface. The height of the contact should be at least as great as the intended ultimate thickness of the luminescence conversion layer. The surface of the chip is coated with luminescence conversion material in a further method step.

With the inventive method, chips that are electrically contactable on the front side can be coated without regard for the front-side contacts. The onerous process of coating while leaving electrical contacts or contact surfaces exposed (e.g. by means of a mask) is thereby reduced to the simple and low-cost approach of coating a continuous surface.

The luminescence conversion material preferably comprises a radioparent matrix material that is replaced with a phosphor.

The matrix material can, for example, comprise $SiO_2$ and/or $Al_2O_3$, whereby the luminescence conversion material attains a consistency (e.g. hardness) that can be thinned down in a number of ways without problems and in a controlled manner.

In a particularly preferred embodiment of the method, the radioparent matrix material comprises an oxide and/or a nitride whose refractive index is between 1.5 and 3.4. The use of a luminescence conversion material whose refractive index does not differ greatly from that of the LED chip surface and is between the refractive index of the LED chip surface and that of the environment eliminates losses of radiant intensity due to reflection at interfaces.

Particularly advantageously, according to the method terminals that are coated with luminescence conversion material are then at least partially exposed by thinning the luminescence conversion material. That is, the electrical terminals need not be exposed completely, but rather it will suffice if only a partial area of an electrical terminal is exposed. This simple expedient makes it possible to use many different coating methods, such as for example vapor deposition or sputtering, for coating front-side electrical terminals.

In a preferred embodiment of the method, the layer of luminescence conversion material is subsequently evened by thinning. Unevenness, for example due to the raised front-side electrical contacts, can materialize in the layer during coating. Thinning the contacts results in smaller fluctuations and better reproducibility of the color coordinates (CIE chromaticity diagram) of the LED light sources.

The color coordinates of the LED light source can subsequently be monitored with particular advantage owing to the top-side electrical contact. This monitoring can preferably be done during the thinning of the applied luminescence conversion material, and is feasible as soon as the top-side electrical contact is exposed.

The thickness of the layer of luminescence conversion material can be adjusted as necessary by thinning.

In addition, the correlation between the thickness of the luminescence conversion layer and the color coordinates can be determined by monitoring the color coordinates of the LED light source. This can be used with particular advantage to adjust the color coordinates selectively by thinning the applied luminescence conversion material.

The method is particularly preferably suited for the simultaneous production of plural LED light sources through the use of a multiplicity of similar LED chips that are preferably still disposed together in an original wafer composite. The respective method steps for the chips of the wafer composite take place at least substantially simultaneously. This results in much more efficient and lower-cost production of the LED light sources.

Since an LED chip can emit light not only from the front side but also laterally, with chips of this kind it is particularly advantageous also to at least partially coat the lateral sides of the LED chip with luminescence conversion material. When coating a multiplicity of LED chips in the wafer composite, it is advantageous in this case to create troughs, along scribe lines between the individual chips, which can then be at least partially filled with luminescence conversion material during the subsequent coating of the chip.

A further possibility is first to fixedly mount the entire wafer composite with its underside on a carrier and then to singulate the chips from the wafer composite in such a way that they continue to be held together on the carrier, i.e., are still held in a composite by means of the carrier. This also ensures that the lateral sides of the LED chip will be at least partially coated with luminescence conversion material during the subsequent coating process.

The possibility of monitoring the color coordinates of the LED light source during the thinning of the luminescence conversion material can also be utilized advantageously when the inventive method is used for the simultaneous production of a plurality of LED light sources from a multiplicity of similar chips in a wafer composite. Determining and recording the respective color coordinates and positions of the LED light sources in the wafer composite makes it possible to sort the LED light sources according to their color coordinates, in order to obtain LED light sources whose color coordinates meet more precise specifications.

The inventive method can be used particularly advantageously to adjust the LED light sources of an entire wafer composite to a given set of color coordinates with utmost precision. Since the height of the LED chips of a wafer composite is not uniform over the entire wafer, and height variations of for example 20 µm can occur, uniform thinning of the luminescence conversion material over the entire wafer leads to different thicknesses for the luminescence conversion material. This problem can be solved with the aid of the inventive method by dividing the wafer into regions of LED light sources of like color coordinates once the respective color coordinates and positions of the LED light sources in the wafer have been determined and recorded. Each of these regions can be adjusted to a specific set of color coordinates by thinning the luminescence conversion material of the individual regions in a region-selective manner while continuously monitoring the color coordinates of one of the LED light sources in the region concerned.

DESCRIPTION OF DRAWINGS

Further advantages and preferred embodiments will emerge from the following description of three embodiment examples in conjunction with FIGS. 1a to 2b. Therein.

DETAILED DESCRIPTION

Figure 1A:
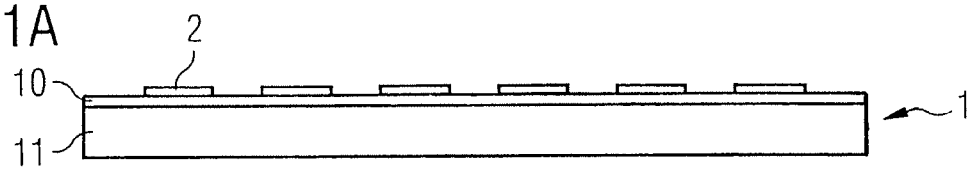
FIGS. 1a to 1f are schematic sectional views of a wafer during various method stages of an embodiment example.

FIG. 1a shows a wafer 1, comprising an SiC substrate 11 and an InGaN-based epitaxial semiconductor layer sequence 10 with a radiation-emitting active zone (not illustrated). The active zone comprises, for example, a radiation-generating p-n junction or a radiation-generating single or multiple quantum structure. Structures of this kind are known to the skilled person and thus will not be explained in more detail. A multiple quantum structure is described, for example, in WO 01/39282 A2, whose content in that respect is incorporated by reference. Front-side electrical contact surfaces 2 are applied to wafer 1 in each of a plurality of chip frames.

Figure 1B:
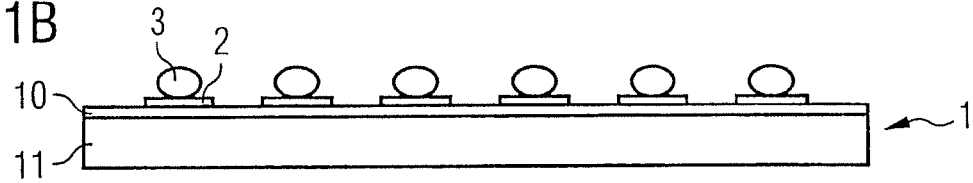

A further method step is illustrated in FIG. 1b, in which the height of the electrical contacts is increased by applying an electrically conductive material 3 to electrical contact surfaces 2. Here the electrically conductive material 3 is roughly ellipsoid and can be gold, for example. The fact that the electrically conductive material 3 merely has to have a minimum height, and not the same height in each case, is a further advantage of the method.

Figure 1C:
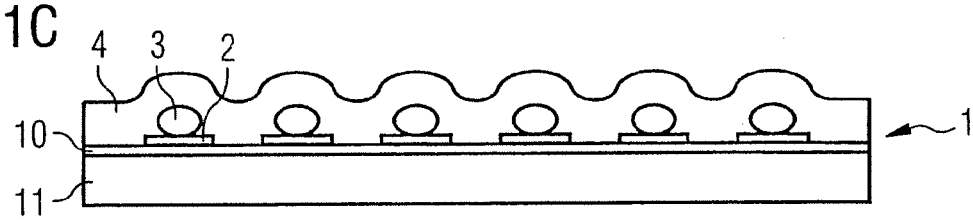

Thereafter, as depicted in FIG. 1c, the entire front-side surface of the wafer composite 1 is coated with a luminescence conversion material 4, which can be done, for example, by vapor-deposition, sputtering, spin-coating or another surface coating method. The luminescence conversion material can, for example, be a Ce-doped garnet material, particularly YAG:Ce. In this step as well, it is important that the applied layer of luminescence conversion material 4 have a certain minimum thickness over the entire region of the wafer.

Figure 1D:
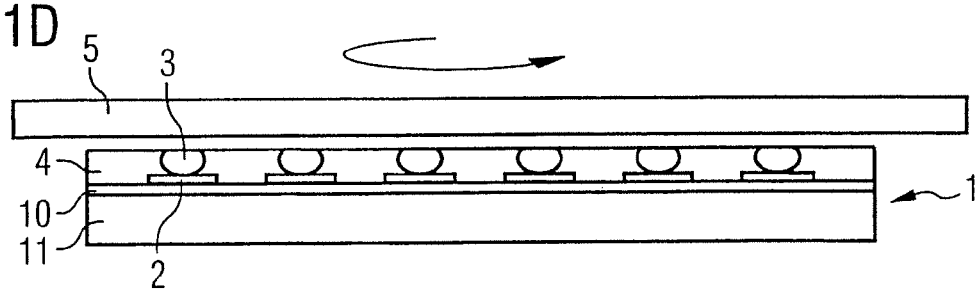

A uniform thickness for the applied layer of luminescence conversion material 4 is achieved by subsequent thinning of the cured luminescence conversion layer, which is illustrated in FIG. 1d. The thinning is performed abrasively by means of a grinding surface 5.

Figure 1E:
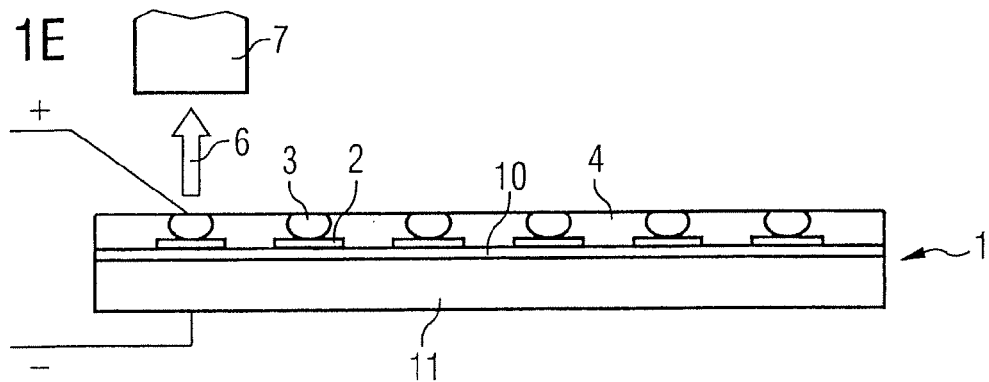

As soon as the electrically conductive material 3 is exposed by thinning, selective electrical contacting is possible, together with the application of a voltage to regions of individual chips. This makes it possible to determine the color coordinates of the emitted light 6 by means of a spectrometer 7, as illustrated in FIG. 1e. The thinning is continued selectively until, for example, all the LED light sources emit white light.

It is, for example, possible to thin the luminescence conversion material in substantially the same degree over all the chips. Since the color coordinates of the LED chips of a wafer usually vary in a distributed manner across the wafer, the wafer can alternatively be divided into regions containing LEDs that have similar color coordinates. The luminescence conversion material is then thinned down in a regionally selective manner and the color coordinates of the LED light sources in a region are adjusted, advantageously by, for example, continuously monitoring the color coordinates of only one LED light source in a region during the thinning process. The respective color coordinates and positions on the wafer of all the LED light sources can then be determined and recorded, e.g. by producing what is known as a wafer map.

Figure 1F:
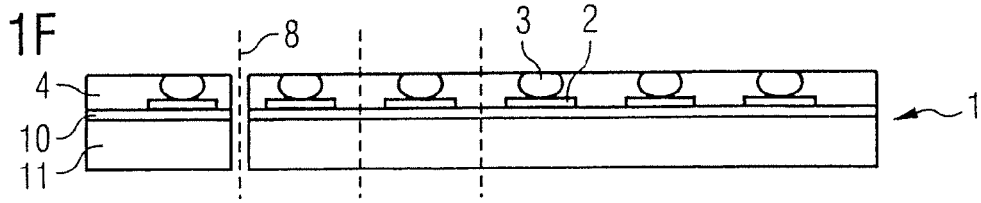

FIG. 1f, finally, depicts the singulation of the chips from the wafer composite 1 along scribe lines 8. This can be done by sawing, for example. The singulated chips can now be sorted on the basis of their color coordinates.

Figure 2A:
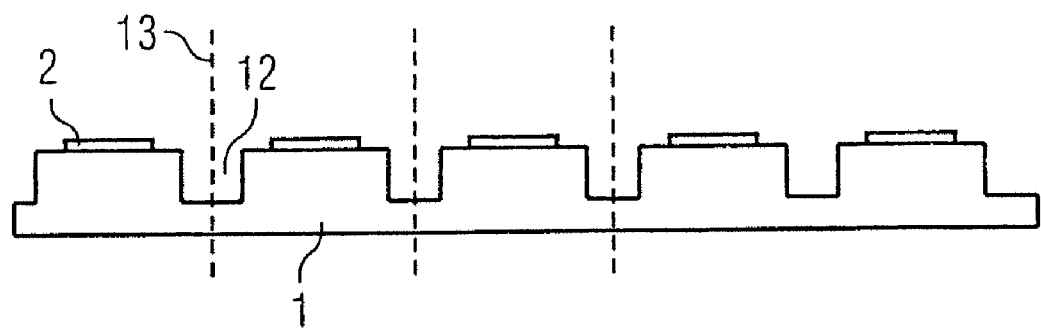
FIGS. 2a and 2b are schematic sectional views of a wafer during various method stages of a second embodiment example.
Figure 2B:
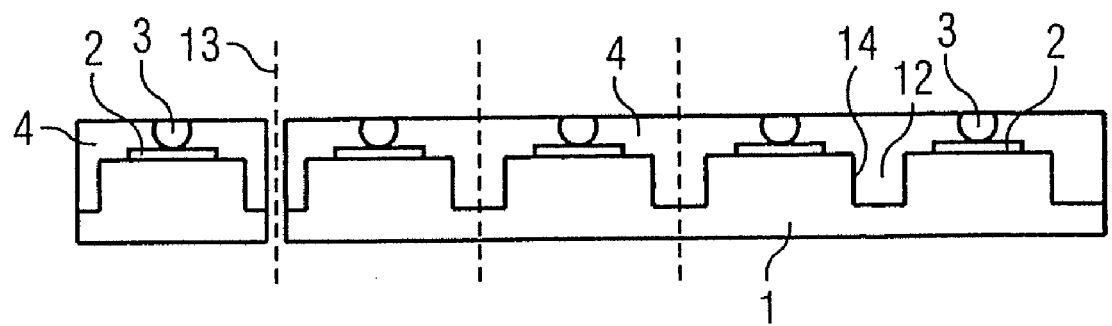

In the second embodiment example of the inventive method, illustrated in FIGS. 2a and 2b, in contrast to the above-described embodiment example according to FIGS. 1a to 1f, prior to coating with luminescence conversion material 4, troughs 12 are produced (FIG. 2a) on the front side in the chip frame on wafer 1 along scribe lines 13; this can be done by sawing, for example. As the method proceeds, enough luminescence conversion material 4 is applied to the front sides of the chips so that over the troughs 12 the layer reaches at least to above the electrically conductive material 3 (FIG. 2b) applied to electrical contact surfaces 2. The sides 14 of the troughs 12 thus are completely covered with luminescence conversion material 4. The luminescence conversion material 4 deposited in the troughs 12 causes radiation decoupled through the lateral sides of the chip to be converted as well. As illustrated in FIG. 2b, after the luminescence conversion material 4 has been thinned, the chips are singulated along scribe lines 13.

Instead of troughs being produced along scribe lines on the front side of the wafer, the wafer can alternatively be mounted with its underside on a carrier and the chips can subsequently be singulated from the wafer composite in such fashion that they are held together by the carrier and the individual chips have a defined spacing from one another (not shown). The singulation can be performed by sawing, for example. The carrier can be an adhesive and/or stretch film, for example. A stretch film can, for example, be stretched after the singulation of the chips so as to uniformly increase the mutual spacing of the chips in one or more directions.

Luminescence conversion material can then be applied to the carrier so that the gaps between adjacent chips are partially or completely filled. In this embodiment example, all the surfaces of the chip including the back side can be completely covered with luminescence conversion material, thus permitting an especially homogeneous radiation characteristic for LED light sources produced in this manner.

Figure 3A:
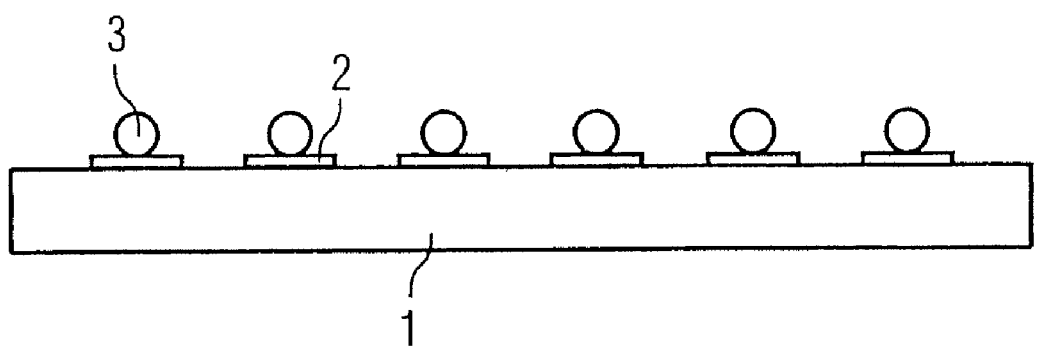
FIGS. 3a and 3b are schematic sectional views of a wafer during various method stages of a third embodiment example of the inventive method.
Figure 3B:
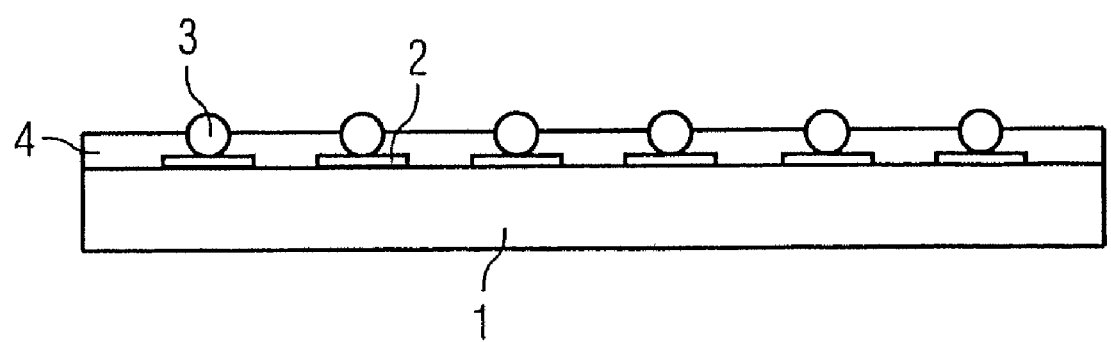

In the third embodiment example, depicted in FIGS. 3a and 3b, in contrast to the above-described embodiment example according to FIGS. 1a and 1f, luminescence conversion material 4 is applied in such a way that the applied electrically conductive material 3 is not covered on the front side. This can be effected, for example, by using a luminescence conversion material 4 of very low viscosity, which is applied to at least one location between the electrical contacts and then, owing to its low viscosity, spreads evenly over the surface. No thinning of the luminescence conversion material is needed in this case, and the electrically conductive material 3 remains at least partially exposed. Once the luminescence conversion material 4 has cured, the LED light sources can be singulated.

The description of the method on the basis of the embodiment examples is, of course, not to be construed as limiting the invention thereto. For example, the front side of the chip can be the side of the substrate facing away from the semiconductor layer sequence, which is the case, for example, with LED chips intended for flip-chip mounting. The chip can also have more than one electrical contact on its front side. In general, the invention encompasses every novel feature and every combination of disclosed features, particularly including every combination of features set out in the claims, even if that combination is not explicitly cited in the claims.

What is claimed is:

1. A method for producing light sources, the method comprising:
   preparing a plurality of light emitting chips, each comprising a front-side electrical contact in the form of an electrical contact surface, and disposing the plurality of chips in a wafer composite;
   thickening the front-side electrical contact of each of the chips by applying an electrically conductive material to each electrical contact surface;
   mounting the wafer composite on a carrier material comprising a stretch film;
   at least partially singulating the chips so that the chips remain attached to the wafer composite on the carrier material;
   stretching the film to increase spacings between at least some of the chips; and
   coating each of the chips with a luminescence conversion material,
   wherein during coating of the chips with the luminescence conversion material, lateral surfaces of the at least partially singulated chips are at least partially coated with the luminescence conversion material.

2. The method as described in claim 1, wherein said luminescence conversion material comprises a radioparent matrix material that is embedded with a phosphor.

3. The method as described in claim 2, wherein said radioparent matrix material comprises $SiO_2$ and/or $Al_2O_3$.

4. The method as described in claim 2, wherein said radioparent matrix material comprises an oxide and/or a nitride whose refractive index is between 1.5 and 3.4.

5. The method as described in claim 1, wherein electrical terminals that are coated with luminescence conversion material are then exposed by thinning the luminescence conversion material.

6. The method as described in claim 1, wherein the layer of luminescence conversion material is evened by thinning.

7. The method as described in claim 1, wherein monitoring of the color coordinates (CIE chromaticity diagram) of the light emitting chips is subsequently performed.

8. The method as described in claim 1, wherein the thickness of the layer of luminescence conversion material is adjusted by thinning it.

9. The method as described in claim 8, wherein during said thinning, the color coordinates of the light emitting chips are adjusted over the thickness of the layer of luminescence conversion material by being monitored.

10. The method as described in claim 1, wherein
    each of the method steps takes place simultaneously for the chips of the entire wafer composite.

11. The method as described in claim 1, wherein before the chips are coated with luminescence conversion material, troughs are made along scribe lines between the individual chips, so that during the subsequent coating of the chips with luminescence conversion material said troughs are at least partially filled with luminescence conversion material.

12. The method as described in claim 1, wherein the chips are subsequently singulated into LED light sources from their composite held together by said carrier and said luminescence conversion material.

13. The method as described in claim 12, wherein before said chips are singulated into LED light sources their respective color coordinates and positions are determined and recorded, and after singulation the LED light sources are sorted on the basis of their color coordinates.

14. The method as described in claim 12, wherein before the chips are singulated the following method steps are performed:
- determining and recording the respective color coordinates and positions of the LED light sources,
- dividing the wafer into regions containing LED light sources that have similar color coordinates,
- adjusting the regions containing LED light sources that have similar color coordinates to a specific set of color coordinates by regionally selective thinning of the luminescence conversion material in the individual regions, and
- monitoring the color coordinates of one of the LED light sources of the region concerned.

15. The method as described in claim 1, wherein the light emitting chips are mixed color LEDs.

16. The method as described in claim 1, further comprising completing singulation of the plurality of chips from the wafer composite to form a plurality of separated LED light sources.

17. The method as described in claim 1, wherein the electrically conductive material is applied to each member of the plurality of light emitting chips at the same time, and the luminescence conversion material is applied to each member of the plurality of light emitting chips at the same time.

18. The method as described in claim 1, wherein the carrier material comprises an adhesive film.

19. The method as described in claim 1, wherein coating each of the chips with the luminescence conversion material comprises at least partially filling spaces between each of the chips on the stretched film with the luminescence conversion material.

20. The method as described in claim 1, wherein coating each of the chips with the luminescence conversion material comprises completely filling spaces between each of the chips on the stretched film with the luminescence conversion material.

* * * * *